United States Patent [19]

Nakaya

[11] Patent Number: 5,690,785
[45] Date of Patent: Nov. 25, 1997

[54] LITHOGRAPHY CONTROL ON UNEVEN SURFACE

[75] Inventor: Hiroshi Nakaya, Hamamatsu, Japan

[73] Assignee: Yamaha Corporation, Japan

[21] Appl. No.: 613,475

[22] Filed: Mar. 11, 1996

[30] Foreign Application Priority Data

Mar. 13, 1995 [JP] Japan .................. 7-080822

[51] Int. Cl.$^6$ .................. H01L 21/00
[52] U.S. Cl. .................. 156/626.1; 156/644.1; 156/656.1; 156/659.11; 437/8; 216/59
[58] Field of Search .................. 156/626.1, 644.1, 156/656.1, 659.11; 437/8; 216/60, 59

[56] References Cited

FOREIGN PATENT DOCUMENTS

| 0585041 | 3/1994 | European Pat. Off. . |
| 555116 | 3/1993 | Japan . |
| 5275314 | 10/1993 | Japan . |

*Primary Examiner*—William Powell

[57] ABSTRACT

A reticle pattern is transferred to a semiconductor wafer with a coated resist film by using a reduction (demagnification) exposure system having a focus sensor and an autofocus mechanism operating in response to an output of the focus sensor. An average level of a plurality of autofocus points in a chip area is calculated while the semiconductor wafer is mounted on a stage. The semiconductor wafer is scanned and levels of the surface in the chip area are sampled. From the distributions of sampled surface levels, a stepped surface level to be focussed is derived. An offset value between the average level and the stepped surface level to be focussed is derived and an autofocus point is corrected by the offset value to expose the chip area of the semiconductor wafer. A method of exposing a semiconductor wafer is provided which can perform an exposure most suitable for each process, by identifying a stepped surface level to be automatically focussed.

10 Claims, 11 Drawing Sheets

1

LITHOGRAPHY CONTROL ON UNEVEN SURFACE

BACKGROUND OF THE INVENTION a) Field of the Invention

The present invention relates to exposure technology, and more particularly to a method of exposing an uneven surface with a reduction (demagnification) exposure system having an autofocussing function.

b) Description of the Related Art

Precision of fine processing of semiconductor integrated circuits depends on the precision of exposure and development of a resist film coated on a semiconductor wafer. A reduction exposure system with an autofocussing function is generally used for exposing a resist film. If a large step is formed on a semiconductor wafer in a chip region, a focus point set with an autofocussing function is not necessarily an optimum focus point. The autofocussing function operates to automatically focus a predetermined point on a semiconductor wafer in a chip region. However, this automatically focussed point is set sometimes to a surface different in height from a stepped surface of a chip region intended to be actually focussed.

Several methods of controlling a high precision focus with an exposure system have been proposed. For example, the following methods are known.

(A) Focus values at a plurality of points including a center point in an exposure area are measured. A difference between an average of measured focus values and a measured focus value at the center point is used as an offset value. By using this offset value, corrected focus position information is obtained (Japanese Patent Laid-open Publication No.5-55116).

(B) In accordance with focussing beam exposure position information of a semiconductor wafer, the cross sectional configuration of the wafer at this position is obtained. From this cross sectional configuration, a focus offset value is obtained. By using this focus offset value, an autofocus value obtained by using a focussing beam is corrected.

With the method (A), only an averaged surface of stepped surfaces in an exposure area can be focussed.

With the method (B), a focus is controlled by position information at a particular point. Since position information is required, the focussing work is made complicated.

SUMMARY OF THE INVENTION

It is an object of the present invention to provide a method of exposing a semiconductor wafer capable of providing an optimum exposure by automatically identifying a stepped surface to be focussed at each device manufacturing process.

According to one aspect of the present invention, there is provided a method of exposing a semiconductor wafer in which a reticle pattern is transferred to the semiconductor wafer with a coated resist film by a reduction exposure system having a focus sensor and an autofocus mechanism operating in response to an output of the focus sensor, the method comprising the steps of: calculating an average level of a plurality of autofocus points in a chip area of the semiconductor wafer mounted on a stage; scanning the semiconductor wafer and sampling levels of the surface in the chip area; deriving a stepped surface level to be focussed in accordance with distributions of sampled surface levels; calculating an offset value between the average level and the stepped surface level to be focussed; and correcting an autofocus point by the offset value and exposing the chip area of the semiconductor wafer.

2

The surface level of a chip area to be exposed is sampled and its distributions are obtained. From the distributions, a stepped surface level to be focussed can be derived. Deriving the stepped surface level can be performed by statistical analysis because information of the stepped surface level distribution and the stepped surface to be focussed at the exposure process to follow is known in advance. An average level of a plurality of autofocus points in the chip area can be obtained by using the autofocus mechanism. An offset value between the average level and the stepped surface level to be focussed (this value is also an average level calculated through statistical analysis) is used to correct an autofocus point and thereafter the exposure is performed.

Without supplying position information, the stepped surface level to be automatically focussed can be identified at each exposure process and an exposure most suitable for each exposure process is possible.

As described above, in accordance with the conditions of each process of forming a semiconductor device, the stepped surface level to be automatically focussed can be derived and an exposure can be performed under the optimum focus conditions, allowing high precision of fine processing of semiconductor devices such as integrated circuits.

DETAILED DESCRIPTION OF THE PREFERRED EMBODIMENTS

Embodiments of the invention will be described with reference to the accompanying drawings.

Figure 1:
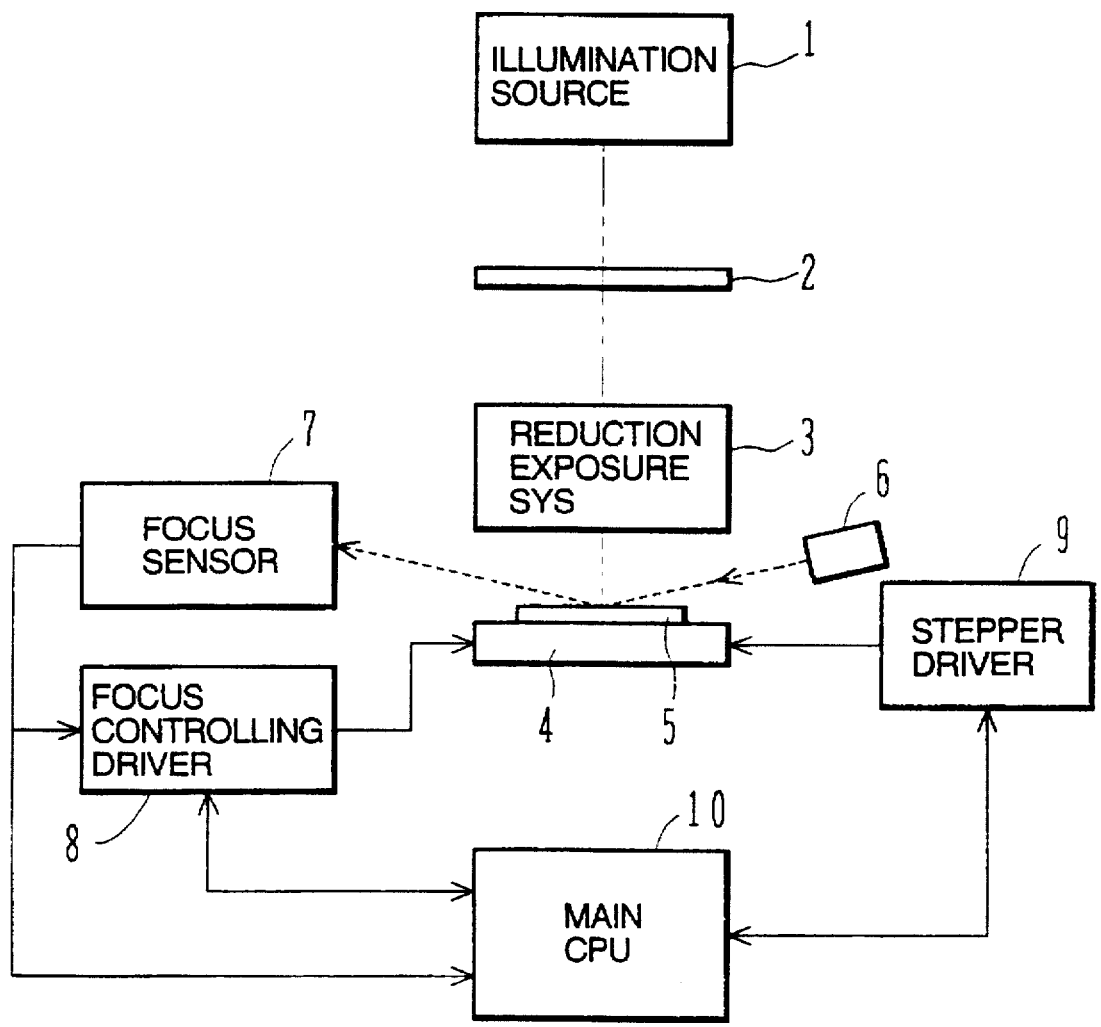
FIG. 1 is a block diagram showing the structure of an exposure system used by an embodiment of the invention.

FIG. 1 is a block diagram showing the structure of a reduction exposure system used by an embodiment of the invention. Exposure light from an illumination source 1 is applied to a reticle 2 set in an optical path. A transmission image of the reticle 2 is demagnified by a reduction exposure system 3 and exposed on a semiconductor wafer 5 having a coated resist film and mounted on a stage 4.

An autofocus mechanism is constituted by a light source 6, a focus sensor 7, and a focus controlling driver 8. The light source 6 applies slantwise a focus detecting light beam to the wafer 5 from the lateral side of the reduction exposure system 3. The autofocus sensor 7 detects light reflected from the wafer 5 and passed through a slit. The focus controlling driver 8 moves the stage 4 up and down in accordance with an output of the focus sensor 7. This autofocus mechanism determines a level (height) at which a maximum light intensity is detected by the focus sensor 7, as the focus point, while the wafer 5 is moved up and down. A stepper driver 9 scans the stage 4 in an X-Y plane to sequentially expose a number of chip areas of the wafer 5. A main CPU 10 controls the whole system.

An exposure process of this embodiment using the exposure system constructed as above will be described.

Figure 2:
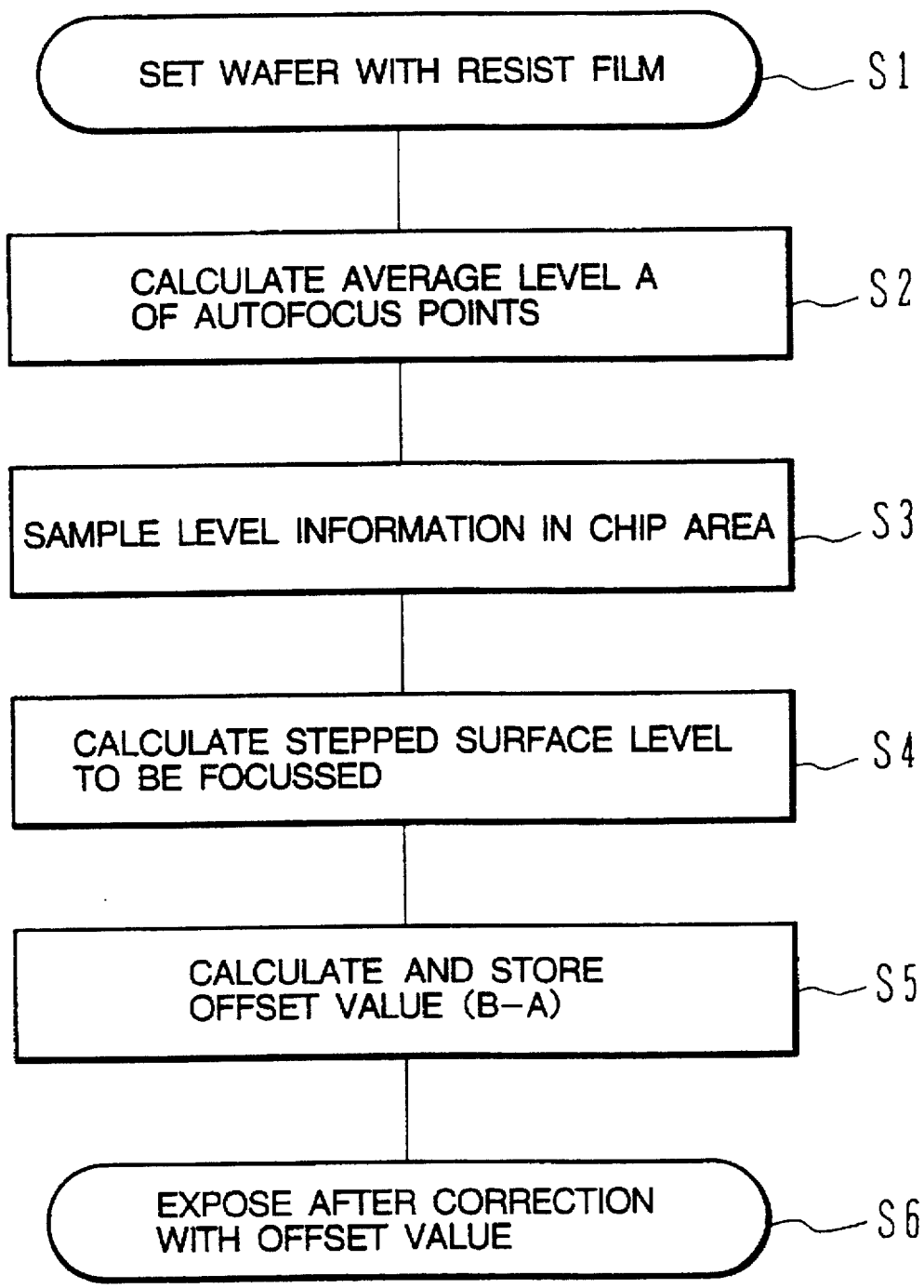
FIG. 2 is a flow chart illustrating a control of an exposure process of the embodiment.

FIG. 2 is a flow chart illustrating the exposure process. After a semiconductor wafer with a coated resist film and a reticle necessary for the exposure are mounted on the exposure system, the exposure process starts (Step S1). First, the semiconductor wafer 5 set on the stage 4 is maintained still, and the autofocus mechanism starts operating. In this state, a plurality of autofocus points are obtained on the semiconductor wafer 5 in a chip region to be exposed.

Figure 3:
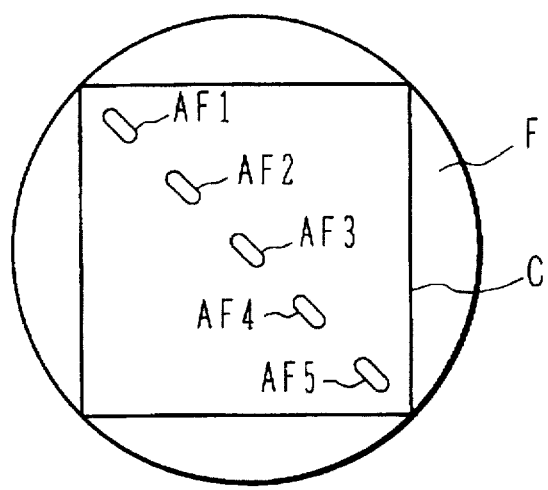
FIG. 3 is a plan view illustrating an autofocus function of the embodiment.

FIG. 3 is a plan view of a chip as viewed down from the reduction exposure system. In a chip region C of an exposure field F, autofocus points, for example, five autofocus points AF1 to AF5 are automatically set. The positions of these autofocus points AF1 to AF5 are fixed. In this embodiment, the main CPU 10 fetches the outputs of the focus sensor 7 and calculates an average level A of the five autofocus points AF1 to AF5 (Step S2).

Figure 4A:
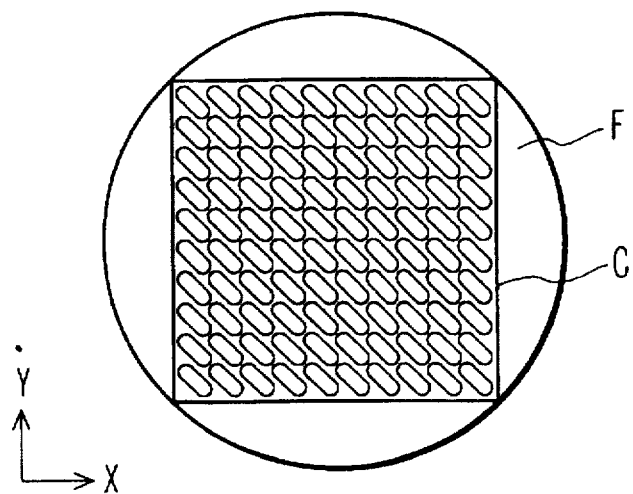
FIGS. 4A to 4C are schematic plan views illustrating sampling of stepped surface levels of the embodiment.

Next, in response to an external instruction, the stepper driver 9 scans the stage 4 to let the whole surface of the chip area be detected by the focus detecting light beam, to sample surface level information in this chip area (Step S3). FIG. 4A is a schematic diagram illustrating how the surface level information is sampled. Five focus spots are shown in FIG. 3, and data sampling points are distributed in ten rows and in ten columns in FIG. 4A. Basically, sampling of ten rows and ten columns per one chip can be made by sampling with five focus spots, ten times for each focus spot in the X direction over a chip area width in one row scanning, sampling ten times in the reverse direction in the next row scanning between the just scanned adjacent two rows.

The numbers of autofocus points and sampling points and the distribution of these points, described above, are only illustrative and they may be changed as desired so as to match each device manufacturing step. If a plurality of focus detecting light beams are used, the chip area can be scanned divisionally so that a time required for sampling can be shortened.

Figure 4B:
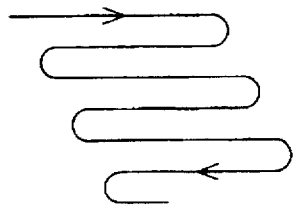
Figure 4C:
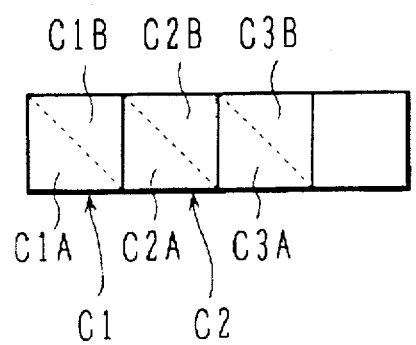

It is preferable to scan each sampling point in a zig-zag way as shown in FIG. 4B. Many adjacent chips have the same pattern. Therefore, as shown in FIG. 4C, even if an area C=C1B +C2A is sampled instead of sampling a chip area C1=C1A+C1B, the sampling results are generally as expected. From this viewpoint, the sampling route shown in FIG. 4B samples the area C =C1B+C2A instead of sampling the chip area C1=C1A+C2A. The size of a focussed spot is preferably selected such that surfaces having different levels on a chip can be separately detected. Such a surface having a different level is called hereinafter a stepped surface. For example, the size of the focussed spot ranges from 20 μm×100 μm to 200 μm×2000 μm.

Next, CPU 10 performs a statistical analysis of sampled level information and derives a stepped surface level B in the chip area to be focussed (Step S4). Information of the stepped surface level distribution and the stepped surface to be focussed at the exposure process to follow is known in advance. Therefore, from this information, the sampled surface level distributions can be classified into peaks of respective stepped surfaces, and one of the peaks can be identified as the stepped surface level B to be focussed, which level B can be derived or calculated as an average value of one level distribution. The details of this autofocus process will be later given.

The main CPU 10 calculates an offset value (B–A) and stores it, the value A being an average level of a plurality of autofocus points obtained at Step S2 and the value B being the stepped surface level to be focussed (Step S5).

These Steps correspond to a pre-process before exposure. In response to an external instruction, an actual exposure process through step-and-repeat is performed (Step S6). In the exposure of each chip area, the offset value is supplied to the focus controlling driver 8 for the correction of the autofocus point.

The Steps of calculating the offset value are basically performed only for products of the first lot, and the autofocus correction for the succeeding lots is performed by using the offset value stored at the first lot. Alternatively, the offset value may be calculated for a set of a plurality of lots. Although sampling is performed for one chip area of a wafer in the above description, it may be performed for a plurality of chip areas collectively.

Next, with reference to FIGS. 5A to 5C and FIGS. 6A to 6F, a method of sampling stepped surface data and calculating an offset value will be detailed in correspondence with device manufacturing processes.

Figure 5A:
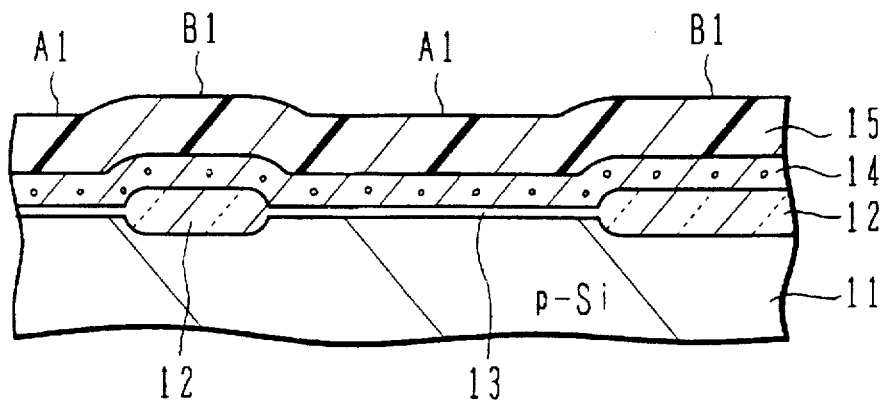
FIGS. 5A to 5C a partial cross sectional view of a wafer illustrating exposure processes of the embodiment.
Figure 5B:
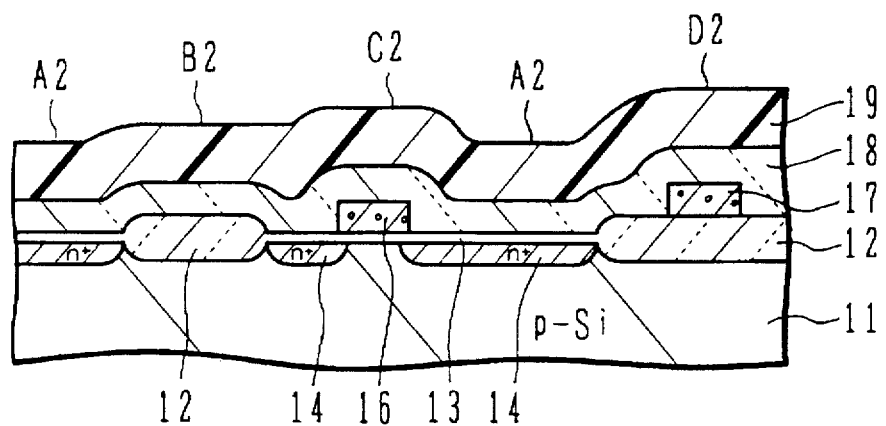
Figure 5C:
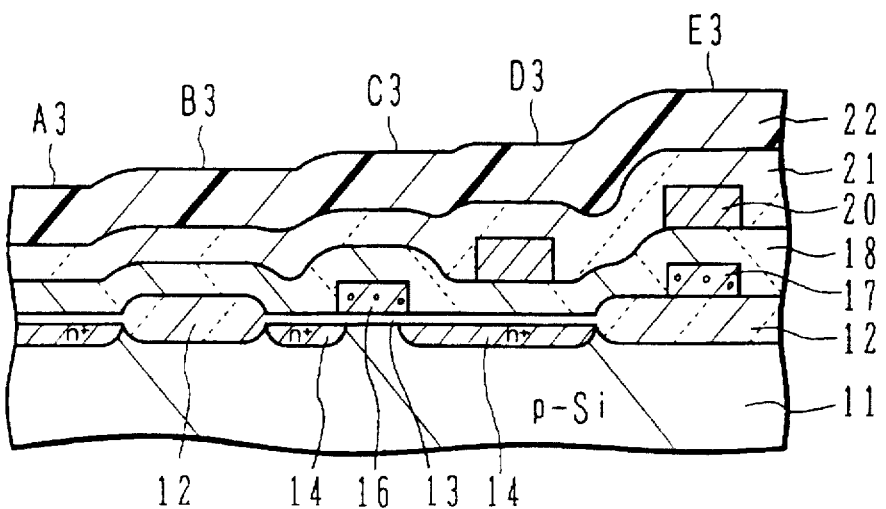

FIGS. 5A to 5C are cross sectional views illustrating several exposure processes for a MOS integrated circuit. FIG. 5A illustrates an exposure process for patterning a gate electrode. On a silicon substrate 1, a LOCOS (local oxidation of silicon) oxide film 12 and a gate oxide film 13 are formed. On the gate oxide film 13, a polysilicon film 14 as a gate electrode is deposited. On the polysilicon film 14, a resist film 15 is spin-coated. Two stepped surfaces A1 and B1 at the active region and at the field oxide film region are formed on the wafer shown in FIG. 5A.

Figure 6A:
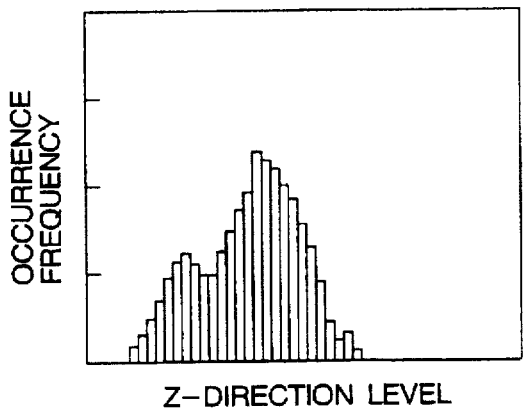
FIGS. 6A to 6F are graphs showing stepped surface sampling data at various exposure steps.
Figure 6B:
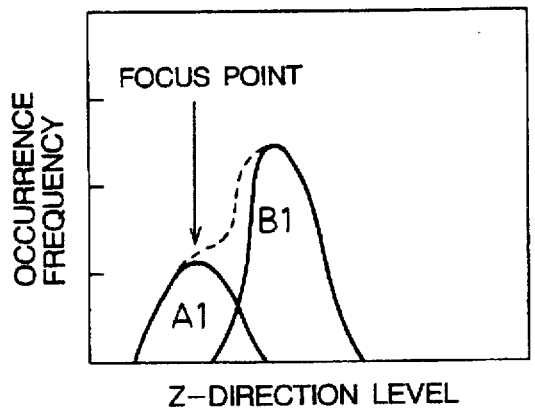

The wafer shown in FIG. 5A is scanned to sample information of levels of the surface in a chip area. An occurrence distribution of sampled information in the height (level) Z direction as shown in FIG. 6A is obtained. Since information of two stepped surfaces A1 and A2 is known in advance, the distribution shown in FIG. 6A is classified into peaks corresponding to the two stepped surfaces as shown in FIG. 6B. Since the stepped surface to be focussed at the exposure process for patterning the gate electrode is A1, the level (focus point indicated by an arrow in FIG. 6A) of the stepped surface A1 to be focussed can be calculated as an average value of the distributions through statistical analysis.

FIG. 5B illustrates an exposure process for forming contact holes for a gate electrode and diffused regions in a first metal wiring layer. A gate electrode 16 and a wiring layer 17 are formed by patterning the polysilicon film. Diffused regions 14 are formed through ion implantation by using the gate electrode 16 and LOCOS oxide film 12 as a mask. An interlayer insulating film 18 is deposited over the substrate, and a resist film 19 is spin-coated on the interlayer insulating film 18. The stepped surfaces formed on the wafer surface are a surface A2 ever the diffused region 14, a surface B2 over the field oxide film region without the wiring layer, a surface C2 over the gate electrode 16, and a surface D2 over the wiring layer 17 on the field oxide film region, respectively in the order of lower to upper level.

Figure 6C:
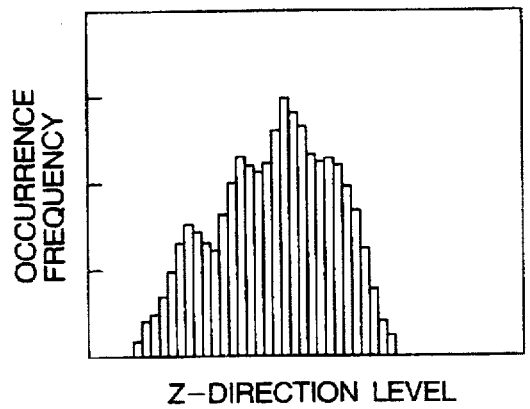
Figure 6D:
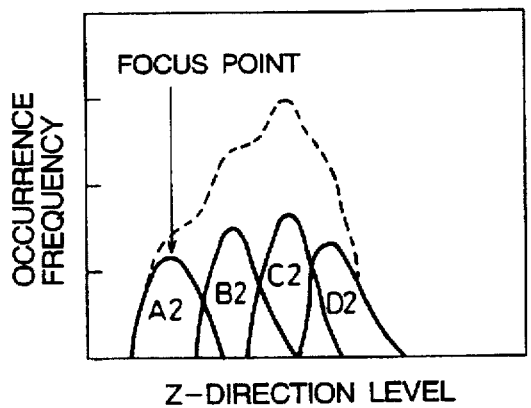

The wafer shown in FIG. 5B is scanned to sample information of levels of the surface in a chip area. An occurrence distribution of sampled information in the height (level) Z direction as shown in FIG. 6C is obtained. This distribution is classified into peaks corresponding to the stepped surfaces as shown in FIG. 6D. Since the stepped surface to be focussed at the exposure process for forming a contact hole is A2, its focus point can be identified.

FIG. 5C illustrates an exposure process for forming via holes for electrical connection between first and second metal wiring layers. After a first metal wiring layer 20 is formed, an interlayer insulating film 21 is deposited. On the interlayer insulating film 21, a resist film 22 is spin-coated. The stepped surfaces formed on the wafer surface are a surface A3 over the diffused region 14 without the wiring layer, a surface B3 over the field oxide film region 12 without the wiring layer, a surface C3 over the gate electrode 16, a surface D3 over the diffused region 14 with the wiring layer 20, and a surface E3 over the field oxide film region with the wiring layer 20, respectively in the order of lower to upper level.

Figure 6E:
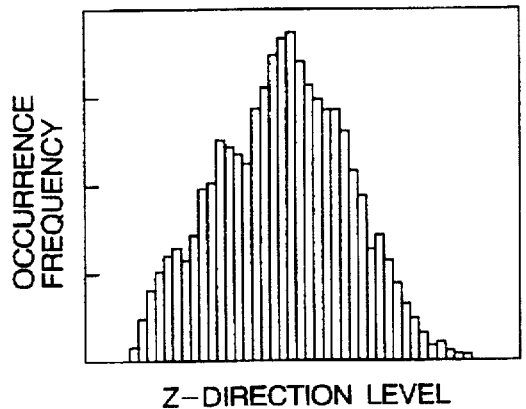
Figure 6F:
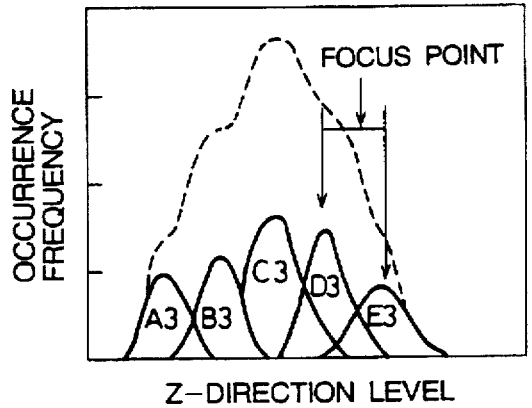

The wafer shown in FIG. 5C is scanned to sample information of levels of the surface in a chip area. An occurrence distribution of sampled information in the height (level) Z direction as shown in FIG. 6E is obtained. This distribution is classified into peaks corresponding to the stepped surfaces as shown in FIG. 6F. The stepped surfaces to be focussed at the exposure process for forming via holes are D3 and E3. It is therefore preferable to focus to the middle level between D3 and E3. From the distributions shown in FIG. 6F, the optimum focus point can be obtained at the middle level between D3 and E3.

In the above description, each stepped surface forms a separated peak. The peaks to be identified is A1 in FIG. 6B, A2 in FIG. 6D, and D3 and E3 in FIG. 6F. If these peaks only can be separately detected, the corresponding focus points can be identified even if other peaks cannot be separately discriminated. The size of a focussed spot is sufficient if it can discriminate between stepped Surfaces to be separately detected.

As described above, in lithography for patterning a (multi-layered) wiring layer of a semiconductor device, at each exposure process (for gate patterning, via hole forming, etc.), the wafer is scanned to obtain level distribution information and an autofocus point is corrected by averages of levels at each process (gate level, insulating film level, first and second metal layer levels, and etc.). In this manner, high precision exposure can be made.

FIG. 7 and FIGS. 8A to 8M illustrate another embodiment of the invention. In this embodiment, a semiconductor device is manufactured which has a multi-layer wiring layer including a gate wiring layer, first and second metal wiring layer, and other layers.

Figure 7:
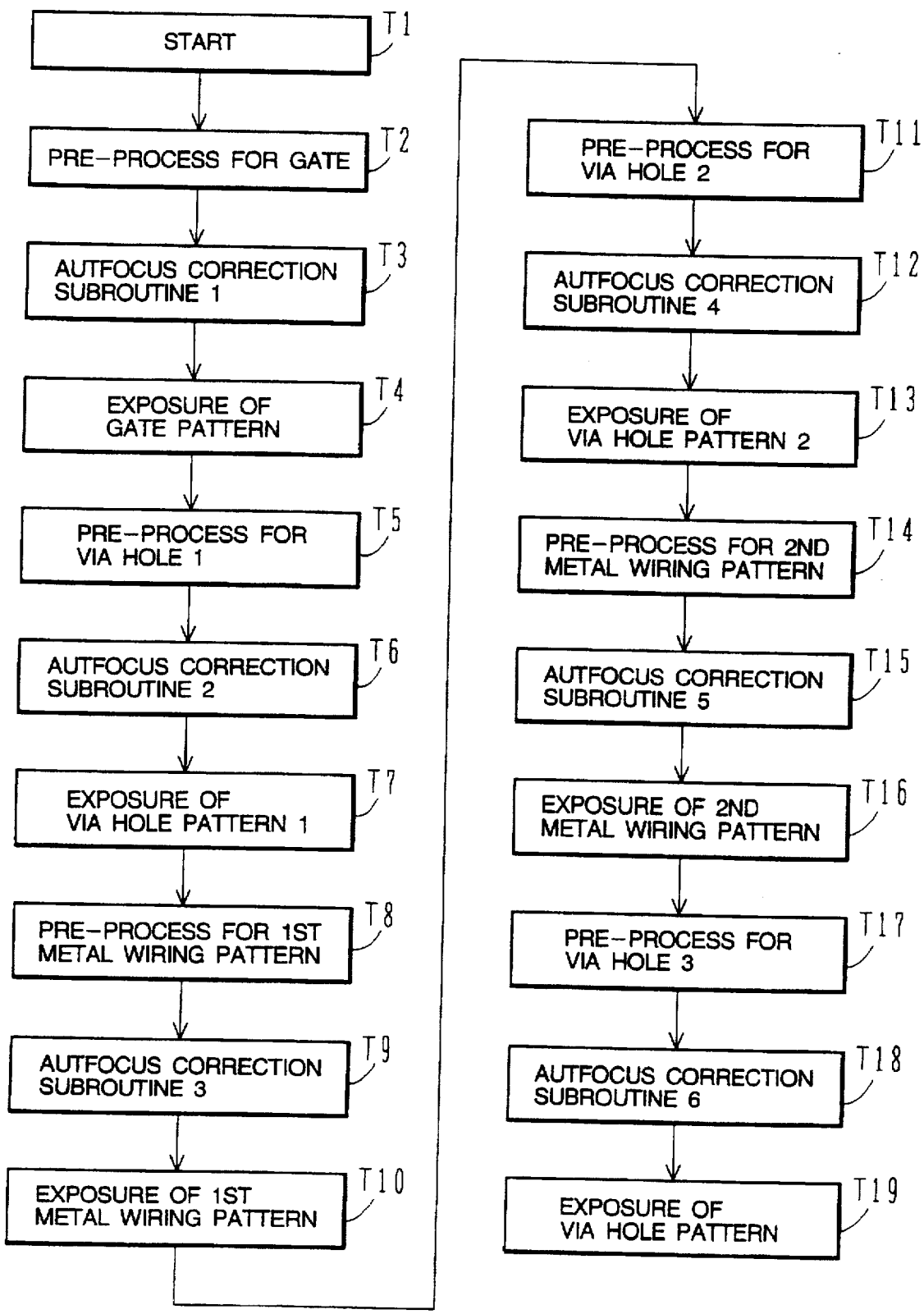
FIG. 7 is a flow chart illustrating an autofocus process according to another embodiment of the invention.
Figure 8A:
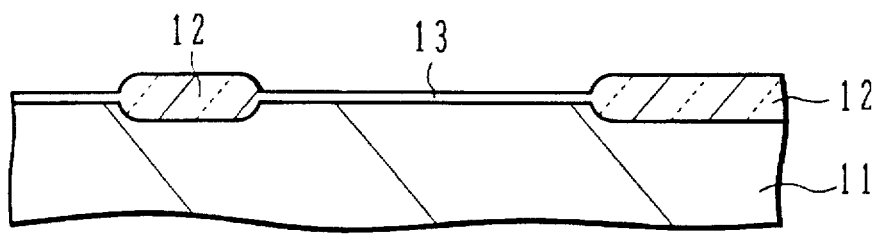
FIGS. 8A to 8M are cross sectional views of a semiconductor device illustrating how the autofocus process illustrated in FIG. 7 is applied.

The process starts at Step T1 in FIG. 7. As shown in FIG. 8A, on a Si substrate 11 of a p-type for example, a field oxide film 12 is formed by a known LOCOS process. A gate oxide film 13 is formed on the surface of an active region surrounded by the field oxide film 12, by thermal oxidation.

Next, a gate pre-process is performed at Step T2 in FIG. 7. This pre-process is a process to be executed before lithography.

Figure 8B:
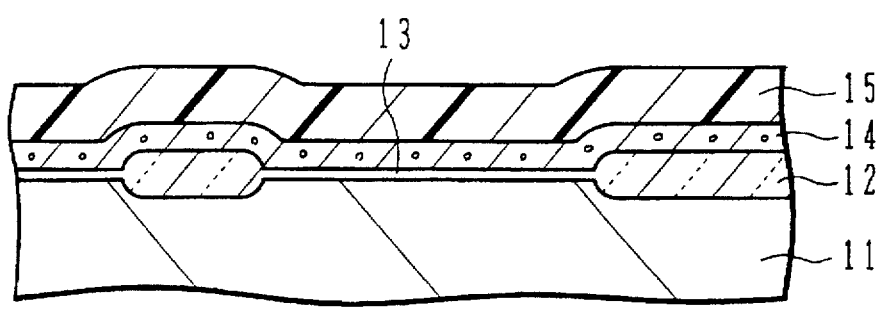

As shown in FIG. 8B, a polysilicon film 14 is deposited over the whole surface of the wafer by chemical vapor deposition (CVD). Instead of a single polysilicon layer, a polycide layer of a laminate of a polysilicon layer and a silicide layer may be used. On the polysilicon layer 14, a resist film 15 is spin-coated.

At Step T3 of FIG. 7, an autofocus correction sub-routine is performed for the preparation of gate pattern exposure. Steps S1 to S5 of FIG. 2 are executed to calculate an offset value for autofocus correction. By using this offset value, the gate pattern is exposed with the corrected focus at Step T4.

Figure 8C:
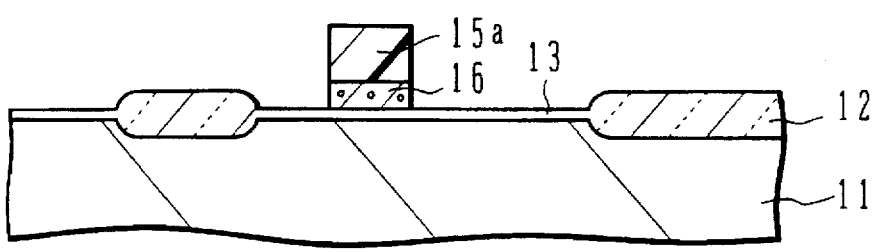

FIG. 8C illustrates a patterning process after the exposure. The exposed resist film 15 is developed to form a resist pattern 15a. By using this resist pattern 15a as a mask, the underlie polysilicon layer 14 is etched to form a gate electrode 16, for example, by anisotropic dry etching. Thereafter, the resist pattern 15a is removed. In the above manner, the insulated gate electrode is formed.

Figure 8D:
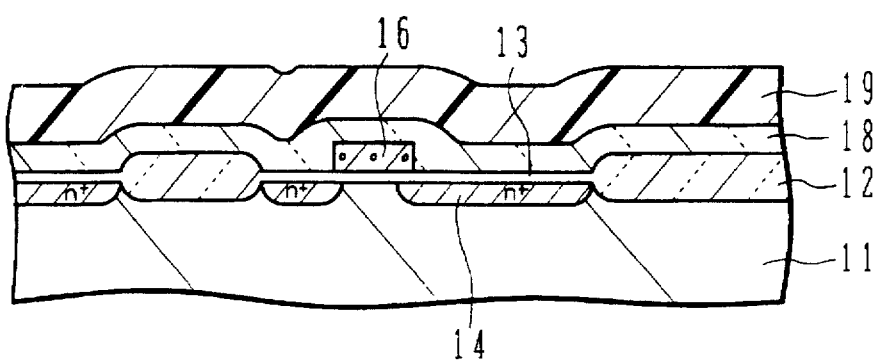

At Step T5 of FIG. 7, a pre-process for a via hole is executed. As shown in FIG. 8D, an interlayer insulating film 18 covering the gate electrode 16 is formed over the substrate by CVD or other processes. The insulating film 18 may be made of $SiO_2$, phosphosilicate glass (PSG), borophosphosilicate glass (BPSG), or other materials. A resist film 19 is spin-coated on the interlayer insulating film 18.

At Step T6 of FIG. 7, an autofocus correction sub-routine for via hole pattern exposure is executed. Namely, Steps S1 to S5 of FIG. 2 are performed to calculate an offset value for autofocus correction. At Step T7, by using this offset value, a via hole pattern is exposed with a corrected focus.

Figure 8E:
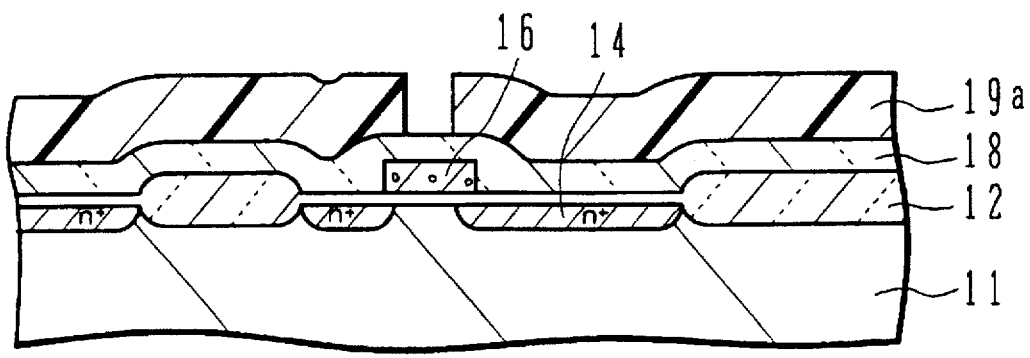

FIG. 8E illustrates a patterning process after the exposure. The exposed resist film 19 is developed to form a resist pattern 19a having a via hole pattern. By using this resist pattern 19a as a mask, the underlie interlayer insulating layer 18 is etched to form a via hole 25, for example, by anisotropic dry etching. Thereafter, the resist pattern 19a is removed. At the same time as a via hole for the gate electrode is formed, a contact hole for diffused regions (source/drain regions) may be formed. In this case, the autofocus correction is adjusted to a middle level of A2 and C2 in FIG. 6D.

Figure 8F:
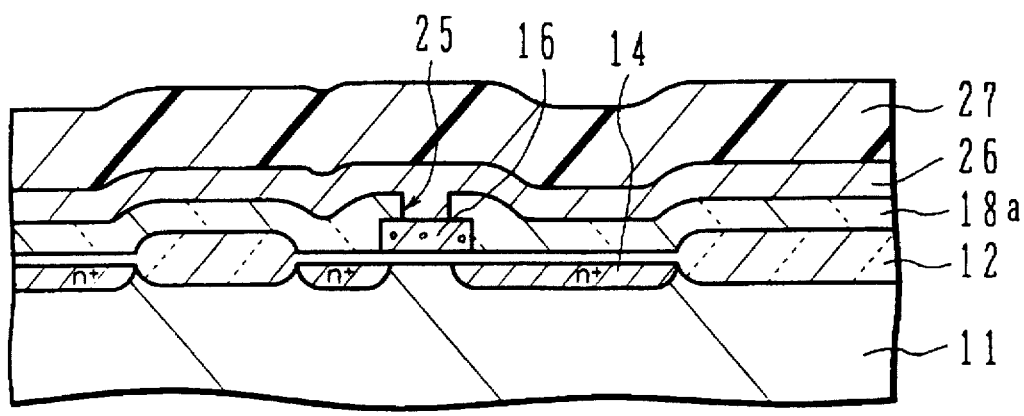

At Step T8 of FIG. 7, a pre-process for a first metal wiring is executed. As shown in FIG. 8F, a first metal wiring layer 26 burying the via hole 25 is formed over the substrate by a laminate of Ti/TiN(TiON)/Al alloy/TiN or the like. A resist film 27 is spin-coated on the first metal wiring layer 26.

At Step T9 of FIG. 7, an autofocus correction sub-routine for first metal wiring pattern exposure is executed. Namely, Steps S1 to S5 of FIG. 2 are performed to calculate an offset value for autofocus correction. At Step T10, by using this offset value, a first metal wiring pattern is exposed with a corrected focus.

Figure 8G:
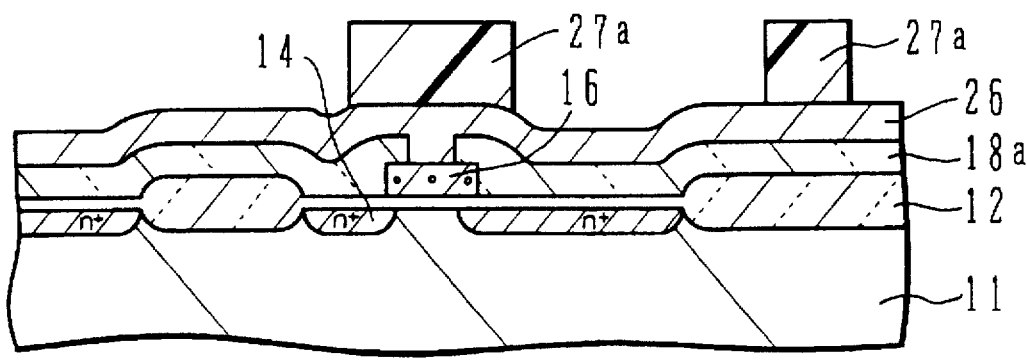

FIG. 8G illustrates a patterning process after the exposure. The exposed resist film 27 is developed to form a resist pattern 27a. By using this resist pattern 27a as a mask, the underlie first metal wiring layer 26 is etched to form a first metal wiring pattern 26a, 26b (FIG. 8H), for example, by anisotropic dry etching. Thereafter, the resist pattern 27a is removed. In the above manner, the first metal wiring pattern is formed.

Figure 8H:
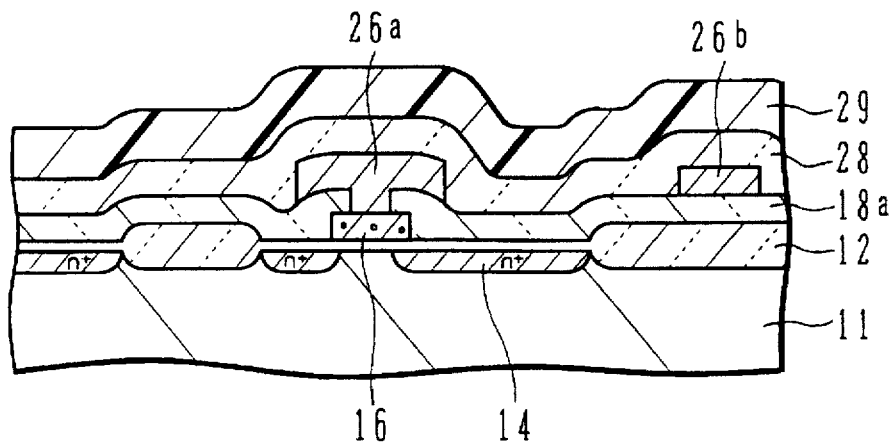

At Step T11 of FIG. 7, a pre-process for a via hole is executed. As shown in FIG. 8H, an interlayer insulating film 28 covering the first metal wiring pattern 26a, 26b is formed over the substrate by CVD or other processes. The insulating film 28 may be made of $SiO_2$, phosphosilicate glass (PSG), borophosphosilicate glass (BPSG), or other materials. A resist film 29 is spin-coated on the interlayer insulating film 28.

At Step T12 of FIG. 7, an autofocus correction sub-routine for via hole pattern exposure is executed. Namely, Steps S1 to S5 of FIG. 2 are performed to calculate an offset value for autofocus correction. At Step T13, by using this offset value, a via hole pattern is exposed with a corrected focus.

Figure 8I:
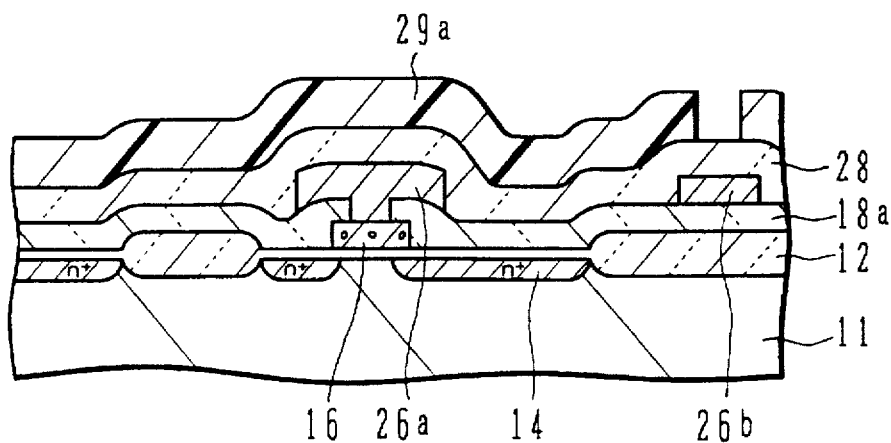

FIG. 8I illustrates a patterning process after the exposure. The exposed resist film 29 is developed to form a resist pattern 29a. By using this resist pattern 29a as a mask, the underlie interlayer insulating layer 28 is etched to form a via hole, for example, by anisotropic dry etching. Thereafter, the resist pattern 29a is removed. In the above manner, the interlayer insulating film with a via hole is formed.

Figure 8J:
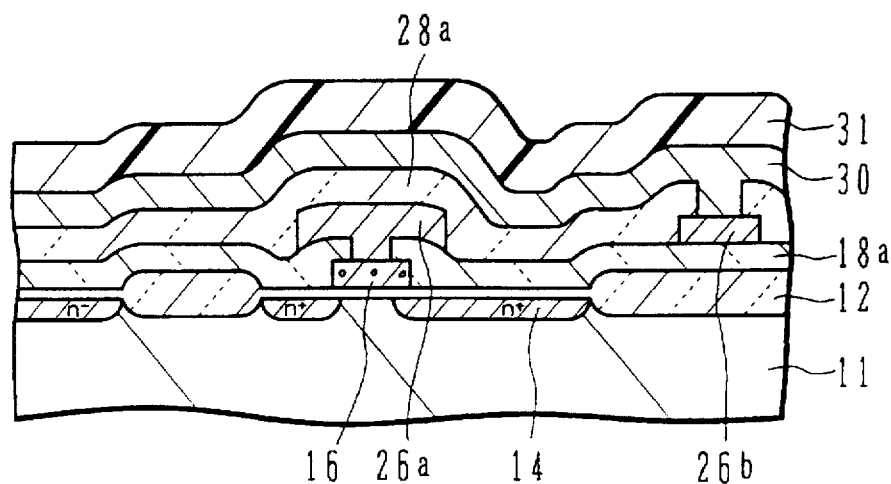

At Step T14 of FIG. 7, a pre-process for a second metal wiring is executed. As shown in FIG. 8J, a second metal wiring layer 30 covering the interlayer insulating film 28a is formed over the substrate. The second metal wiring layer 30 is connected via the via hole to the first metal wiring layer 26a. A resist film 31 is spin-coated on the second metal wiring layer 30.

At Step T15 of FIG. 7, an autofocus correction sub-routine for second metal wiring pattern exposure is executed. Namely, Steps S1 to S5 of FIG. 2 are performed to calculate an offset value for autofocus correction. At Step T16, by using this offset value, a second metal wiring pattern is exposed with a corrected focus.

Figure 8K:
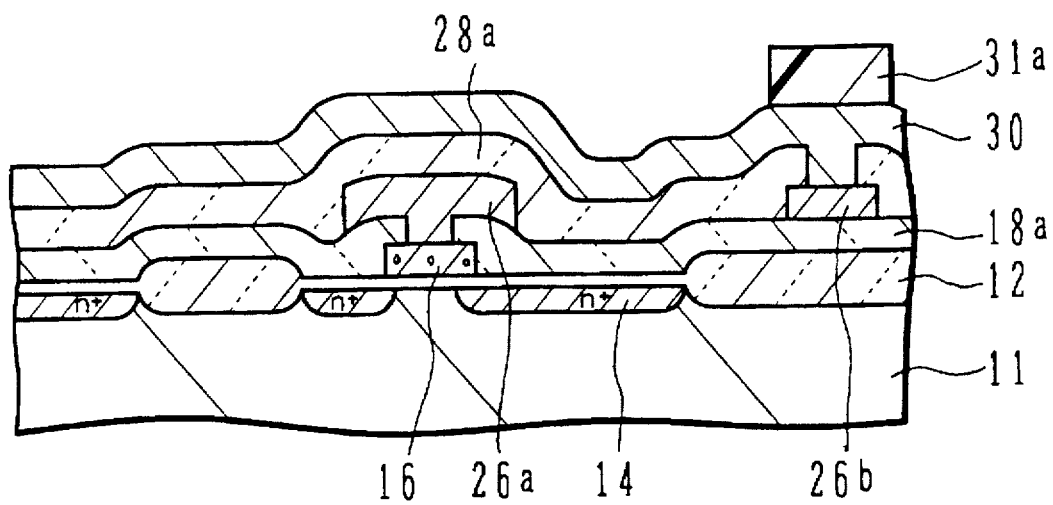

FIG. 8K illustrates a patterning process after the exposure. The exposed resist film 31 is developed to form a resist pattern 31a. By using this resist pattern 31a as a mask, the underlie second metal wiring layer 30 is etched to form a second metal wiring pattern 30a (FIG. 8L), for example, by anisotropic dry etching. Thereafter, the resist pattern 31a is removed. In the above manner, the second metal wiring pattern is formed.

Figure 8L:
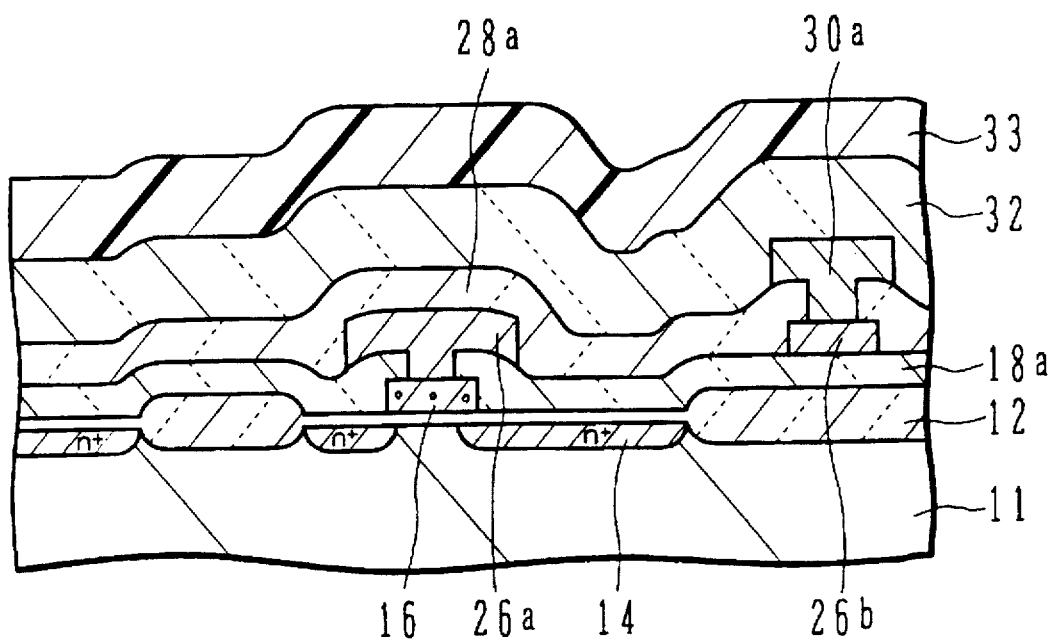

At Step T17 of FIG. 7, a pre-process for a via hole is executed. As shown in FIG. 8L, an interlayer insulating film 32 covering the second metal wiring layer 30a is formed over the substrate. If there is no upper level metal wiring layer, a passivation film, a cap layer, and other layers are formed instead of the interlayer insulating film to complete the semiconductor device. If there is an upper level metal wiring layer, a resist film 33 is spin-coated on the interlayer insulating film 32.

At Step T18 of FIG. 7, an autofocus correction sub-routine for via hole pattern exposure is executed. Namely, Steps S1 to S5 of FIG. 2 are performed to calculate an offset value for autofocus correction. At Step T19, by using this offset value, a via hole pattern is exposed with a corrected focus.

Figure 8M:
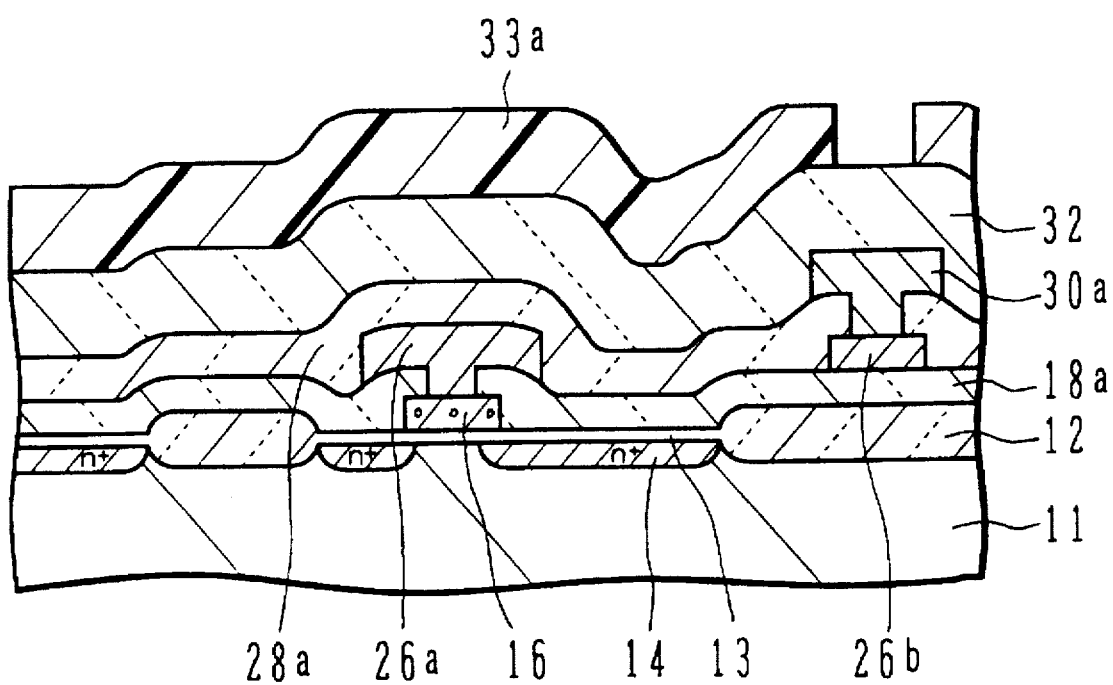

FIG. 8M illustrates a patterning process after the exposure. The exposed resist film 33 is developed to form a resist pattern 33a. By using this resist pattern 33a as a mask, the underlie interlayer insulating film 32 is etched to form a via hole, for example, by anisotropic dry etching. Thereafter, the resist pattern 33a is removed. In the above manner, the interlayer insulating film with a via hole is formed. Thereafter, similar processes to those described with FIGS. 8J and 8K are performed to form a third metal wiring pattern. Thereafter, a passivation film, a cap layer, and other layers are deposited to complete the semiconductor device. More multi-layer metal wiring patterns may be formed by repeating the processed described with FIGS. 8H to 8K.

In the pre-process of FIG. 7, the autofocus correction sub-routine may not be performed in each process, but may be replaced with autofocus correction using a correction value obtained in advance.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of exposing a semiconductor wafer in which a reticle pattern is transferred to the semiconductor wafer with a coated resist film by a reduction exposure system having a focus sensor and an autofocus mechanism operating in response to an output of the focus sensor, the method comprising the steps of:

calculating an average level of a plurality of autofocus points in a chip area of the semiconductor wafer mounted on a stage;

scanning the semiconductor wafer and sampling levels of the surface in the chip area;

deriving a stepped surface level to be focussed in accordance with distributions of sampled surface levels;

calculating an offset value between the average level and the stepped surface level to be focussed; and correcting an autofocus point by the offset value and exposing the chip area of the semiconductor wafer.

2. A method according to claim 1, wherein said sampling step applies a focus beam to the surface of the semiconductor wafer, and samples the levels of the surface while scanning the focussed spots in a zig-zag way.

3. A method according to claim 1, wherein said stepped surface level deriving step derives the stepped surface level to be focussed, by comparing an occurrence frequency distribution of the sampled stepped surface levels and the stepped surface levels expected from the topology of the surface of the semiconductor wafer.

4. A method according to claim 3, wherein said stepped surface level deriving step further includes a step of dividing the occurrence frequency distribution into a plurality of distributions each having a single peak.

5. A method according to claim 1, wherein said average level calculating step includes a step of applying a plurality of focus beams on the semiconductor wafer at the same time and measuring a level of the surface of the semiconductor wafer at each spot of the focus beams.

6. A method of manufacturing a semiconductor device comprising the steps of:

forming a field oxide film on a semiconductor wafer, said field oxide film defining an active region;

forming a gate insulating film on said active region;

forming a gate electrode layer over said gate insulating film and said field oxide film;

measuring an average level of the surface of the semiconductor wafer with said gate electrode layer, a level of the surface above the active region, and a level of the surface above another region;

correcting an exposure system adapted to adjust a focus in accordance with said average level in accordance with a difference between said average level and said level of the surface above the active region, and obtaining a resist pattern through photolithography; and etching said gate electrode layer to form a gate electrode by using said resist pattern as a mask.

7. A method according to claim 6, further comprising the steps of:

forming a first interlayer insulating film covering said gate electrode on the semiconductor wafer;

measuring an average level of the surface of the semiconductor wafer with said first interlayer insulating film, a level of the surface above the gate electrode, and a level of the surface above another region;

correcting an exposure system adapted to adjust a focus in accordance with said average level in accordance with a difference between said average level and said level of the surface above said gate electrode, and obtaining a resist pattern through photolithography; and etching said first interlayer insulating film to form a connection hole by using said resist pattern as a mask.

8. A method according to claim 7, further comprising the steps of:

forming a first metal wiring layer on said first interlayer insulating film with said connection hole;

measuring an average-level of the surface of the semiconductor wafer with said first metal wiring layer, a level of the surface above and near said connection hole, and a level of the surface above another region;

correcting an exposure system adapted to adjust a focus in accordance with said average level in accordance with a difference between said average level and said level of the surface above and near said connection hole, and obtaining a resist pattern through photolithography; and etching said first metal wiring layer to form a first metal wiring pattern by using said resist pattern as a mask.

9. A method according to claim 8, further comprising the steps of:

forming a second interlayer insulating film covering said first metal wiring pattern on the semiconductor wafer;

measuring an average level of the surface of the semiconductor wafer with said second interlayer insulating film, a level of the surface above said first metal wiring pattern, and a level of the surface above another region;

correcting the exposure system adapted to adjust a focus in accordance with said average level in accordance with a difference between said average level and said level of the surface above said first metal wiring pattern, and obtaining a resist pattern through photolithography; and etching said second interlayer insulating film to form a connection hole by using said resist pattern as a mask.

10. A method according to claim 8, further comprising the steps of:

forming a second metal wiring layer on said second interlayer insulating film with said contact hole;

measuring an average level of the surface of the semiconductor wafer with said second metal wiring layer, a level of the surface above and near said connection hole, and a level of the surface above another region;

correcting the exposure system adapted to adjust a focus in accordance with said average level in accordance with a difference between said average level and said level of the surface above and near said connection hole, and obtaining a resist pattern through photolithography; and etching said second metal wiring layer to form a second metal wiring pattern by using said resist pattern as a mask.

* * * * *